(12) United States Patent
Kamins et al.

(10) Patent No.: US 7,719,073 B2
(45) Date of Patent: May 18, 2010

(54) CAPACITIVELY COUPLING LAYERS OF A MULTILAYER DEVICE

(75) Inventors: Theodore I. Kamins, Palo Alto, CA (US); Duncan Stewart, Menlo Park, CA (US); Nathaniel J. Quitoriano, Pacifica, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 392 days.

(21) Appl. No.: 11/652,220

(22) Filed: Jan. 11, 2007

(65) Prior Publication Data

US 2008/0170820 A1 Jul. 17, 2008

(51) Int. Cl.
*H01L 31/0232* (2006.01)
(52) U.S. Cl. .......................... 257/432; 257/80; 257/81; 257/82; 257/98; 257/E31.127
(58) Field of Classification Search .................. 257/80, 257/81, 82, 98, 432, E31.127
See application file for complete search history.

(56) References Cited

U.S. PATENT DOCUMENTS

| | | | |
|---|---|---|---|
| 6,310,400 B1 | 10/2001 | Doyle et al. | |
| 6,790,704 B2 | 9/2004 | Doyle et al. | |
| 6,803,252 B2 | 10/2004 | Lao et al. | |
| 6,968,110 B2 | 11/2005 | Patel et al. | |
| 7,106,598 B2 | 9/2006 | Liu et al. | |
| 7,535,105 B2 * | 5/2009 | Voldman | 257/758 |
| 2003/0095014 A1 | 5/2003 | Lao et al. | |
| 2003/0190814 A1 * | 10/2003 | Kumar et al. | 438/711 |
| 2004/0258348 A1 * | 12/2004 | Deliwala | 385/14 |
| 2005/0106370 A1 | 5/2005 | Takai et al. | |
| 2006/0133744 A1 | 6/2006 | Diaz | |
| 2006/0177173 A1 * | 8/2006 | Shastri et al. | 385/14 |
| 2008/0017971 A1 * | 1/2008 | Hollis | 257/698 |

FOREIGN PATENT DOCUMENTS

KR 10069162 2/2007

* cited by examiner

*Primary Examiner*—Andy Huynh

(57) ABSTRACT

A multilayer device includes an electronic device layer, a first electrode associated with the electronic device layer, an optical layer, a second electrode associated with the optical layer, and an insulator layer provided between the first and second electrodes. The first and second electrodes are capacitively coupled to each other to facilitate electrical communication between the electronic device layer and the optical layer through transmission of an electrical signal between the first and second electrodes. The electrical signal may be transmitted through the insulator layer. In addition, the electronic device layer and the optical layer may be in electrical communication with each other through capacitive coupling of the first electrode and the second electrode.

20 Claims, 6 Drawing Sheets

CAPACITIVELY COUPLING LAYERS OF A MULTILAYER DEVICE

FIELD

The embodiments disclosed herein generally relate to multilayer electronic devices, and more particularly to capacitively coupling layers of a multilayer electronic device to facilitate electrical communication between the layers of the multilayer device.

BACKGROUND

Electronic devices, such as computer chips, are becoming increasingly complex. As more active elements and electronic circuitry are added to computer chips, methods of electrical communication between the active elements and circuitry must also be added to the computer chips. Circuitry on the same layer of an electronic device may be electrically connected by forming one or more layers of metal interconnects above the electronic devices. Metal interconnects are conductive materials that act as interconnections between electronic devices to facilitate the transmission of electrical signals between the electronic devices of a single layer of electronic devices.

However, computer chips are now being developed which have a multilayer structure including multiple parallel layers stacked on top of each other. Multilayer structures allow greater freedom of design and considerably reduce signal path lengths. Multilayer structures may include electronic device layers, each containing electronic devices useful for computing circuitry, and may also include optical device layers and insulator layers. Currently, electrical communication between the multiple layers is facilitated through a process of conductive coupling. In conductive coupling, electrical signals are transferred through layers by forming vias through the entire thickness of an insulating layer. The vias are filled with a conductive material, which physically connects the various layers.

Forming the connecting vias vertically through the layers of the multilayer device adds considerable complexity to the fabrication process. The tolerances required for the etching of the vias limits the density of devices and other circuit components on the layers. Moreover, series resistance in the vias causes resistive-capacitive (RC) time delays and increased power dissipation. Resistance often occurs as a result of unintentional insulator material forming between the conductive components. For example, an oxide layer may accidentally form between conductive components due to the processing of the electrical components. Thus, the conventional method of conductively connecting multiple layers of a multilayer device with physical connectors is wrought with problems.

SUMMARY

A multilayer device includes an electronic device layer, a first electrode associated with the electronic device layer, an optical layer, a second electrode associated with the optical layer, and an insulator layer provided between the first and second electrodes. The first and second electrodes are capacitively coupled to each other to facilitate electrical communication between the electronic device layer and the optical layer through transmission of an electrical signal between the first and second electrodes. The electrical signal may be transmitted through the insulator layer.

A method of electrical communication between an electronic device layer and an optical layer of a multilayer device includes capacitively coupling a first electrode and a second electrode. The first electrode is associated with an electronic device layer of the multilayer device and the second electrode is associated with an optical layer of the multilayer device. The first and second electrodes allow an electrical signal, which may be generated in either the electronic device layer or the optical layer, to be transmitted between the electronic device layer and the optical layer.

BRIEF DESCRIPTION OF THE DRAWINGS

Various features of the embodiments can be more fully appreciated, as the same become better understood with reference to the following detailed description of the embodiments when considered in connection with the accompanying figures.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the embodiments.

A multilayered device and a method of electrical communication between an electronic device layer and an optical layer of the multilayer device are disclosed. An electronic device layer, as will be described in greater detail below, may include a layer having at least an electrical component including electronic devices found in integrated circuits, such as transistors. Similarly, an optical layer is a layer having at least an optical device, such as an optical modulator, which may also have electronic or optoelectronic elements. The method of electrical communication between the electronic device layer and the optical layer involves capacitively coupling a first electrode and a second electrode. Capacitance is a measure of the amount of electric charge stored (or separated) for a given electric potential, and capacitive coupling refers to the transfer of an electrical signal from one electrode to another electrode by means of the mutual capacitance between the two electrodes. The electrical signal transferred between the electrodes may be used to convey information, as will be described in greater detail below. The first and second electrodes may be any conductive or semi-conductive element capable of transferring an electrical charge.

Figure 1:
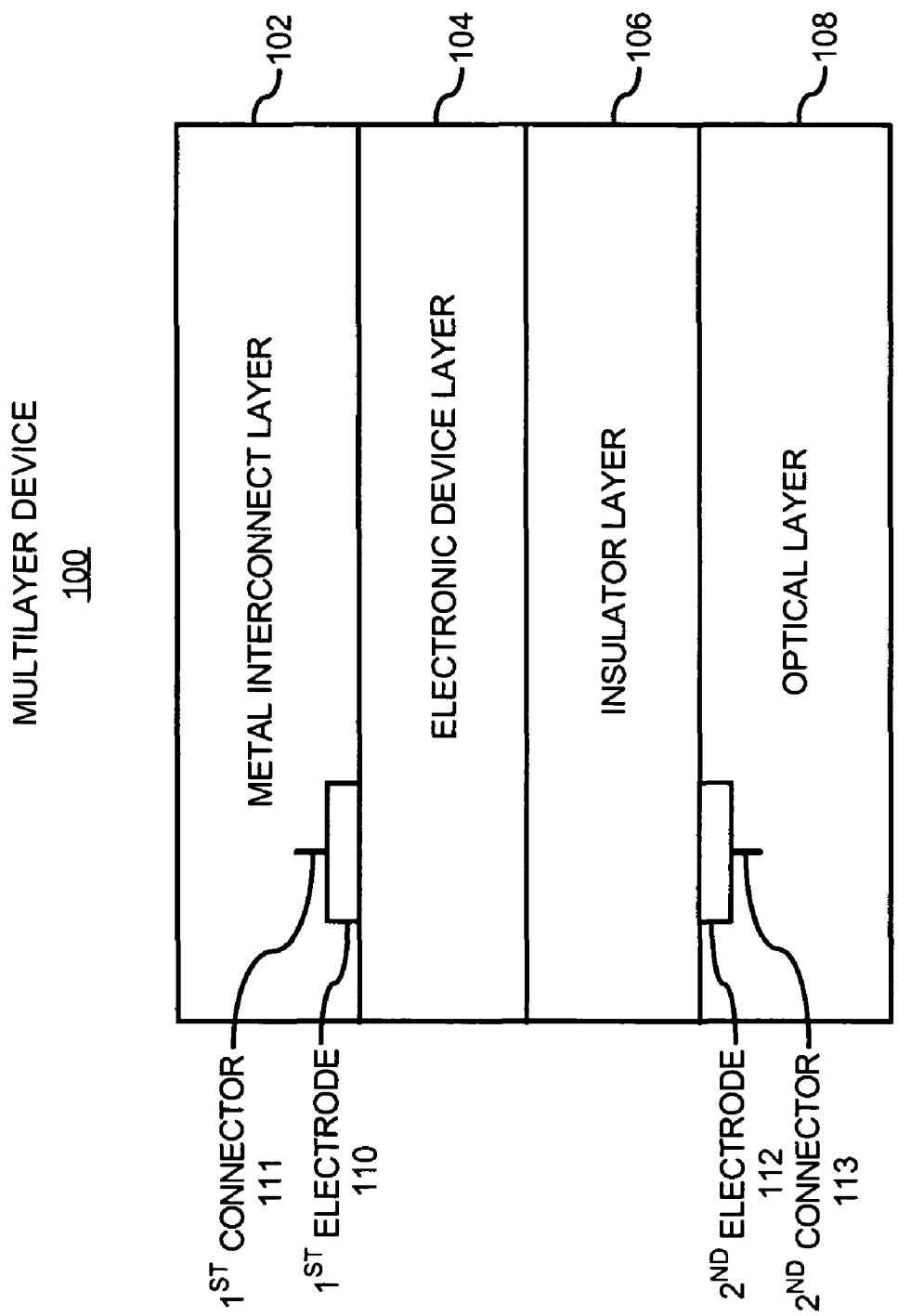
FIG. 1 illustrates a multilayer device having first and second capacitively coupled electrodes, according to an embodiment.

FIG. 1 illustrates a multilayer device 100, according to an embodiment. The multilayer device 100 includes a metal interconnect layer 102, an electronic device layer 104, an insulator layer 106, and an optical layer 108. A person having ordinary skill in the art will appreciate that the multilayer device 100 depicted in FIG. 1 is a simplified embodiment depicting four individual layers and that any number of different layers may be present in the multilayer device 100. Moreover, the different layers may be disposed in any reasonably suitable order or arrangement. For example, the electronic device layer 104 and the metal interconnect layer 102 may include any number of multiple layers and/or may be disposed below the optical layer 108. In addition, the optical layer 108 may also contain interconnections or have an additional layer of interconnections adjacent to the optical layer 108.

As set forth above, the electronic device layer 104 may include any reasonably suitable number and type of electronic components. For instance, the electronic device layer 104 may include any electronic device found in complementary metal-oxide-semiconductor (CMOS) integrated circuits, The electronic devices and interconnections may form a CMOS integrated circuit; examples of CMOS integrated circuits include microprocessors, microcontrollers, static random access memories (RAMs), etc. CMOS chips may include complementary and symmetrical pairs of p-type and n-type metal-oxide-semiconductor field-effect transistor (MOSFET, MOS-FET, or MOS FET) for logic functions. MOSFETs are common field-effect transistors (FETs) in both digital and analog circuits. The electronic device layer 104 may include any reasonably suitable number of components and may have any reasonably suitable number of layers. The electronic device layer 104 may also include any conductive, semi-conductive, or insulator materials known in the art.

The metal interconnect layer 102 may include any reasonably suitable elements for interconnecting the components of the electronic device layer 104. Interconnecting elements are known in the art and may include any reasonably suitable conductive or semi-conductive materials.

The optical layer 108 may include at least an optical device. For example, the optical layer 108 may include waveguides, photodetectors, devices for modulating light, devices for routing light, etc. The optical layer 108 may also include devices for converting electrical signals to optical signals and vice versa. For instance, the optical devices in the optical layer 108 may route light to a photodetector and convert the light into a photocurrent. The photocurrent may be transformed into a conventional digital voltage signal by a transimpedance amplifier (TIA), for example. A person having ordinary skill in the art will appreciate that any reasonably suitable number and types of optical devices may be included in the optical layer 108. Similarly, the optical layer 108 may also include non-optical electronic circuitry and/or devices.

As shown in FIG. 1, the electronic device layer 104 and the optical layer 108 are separated by an insulator layer 106. The insulator layer 106 may be any reasonably suitable material capable of inhibiting the flow of an electric current. For example, the insulator layer 106 may include silicon dioxide or any other reasonably suitable insulator material and may include a substantially uniform material or a mixture or layers of different materials. The insulator layer 106 may be any reasonably suitable size or thickness and may be substantially uniform in thickness or may vary in thickness, as will be described in greater detail below. The insulator layer 106 may be provided between the electronic device layer 104 and the optical layer 108 to provide electrical isolation to the electronic device layer 104 and optical confinement to the optical layer 108.

The insulator layer 106 generally inhibits direct physical electrical conductivity between the components of the electronic device layer 104 and the optical and electronic devices of the optical layer 108. Therefore, according to the embodiments described herein, communication may be facilitated between the electronic device layer 104 and the optical layer 108 by capacitively coupling a first electrode 110 and a second electrode 112.

The first electrode 110 may be associated with the electronic device layer 104, while the second electrode 112 may be associated with the optical layer 108. The terms "associated with" generally means that the electrodes are in direct electrical communication with a component or device of their respective layers. For example, the first electrode 110 may be connected to the electronic device layer 104 by the first connector 111. In other embodiments, the first electrode 110 and the first connector 111 may be part of the electronic device layer 104 or the metal interconnect layer 102. The first connector 111 may be any device or region capable of connecting the first electrode 110 to the electronic device layer 104 or a component of the electronic device layer 104. For instance, the first connector 111 may be a wire connecting the first electrode 110 to a source or drain region of a FET, for example. As set forth above, the first connector 111 may be a component of the metal interconnect layer 102 or the first connector 111 may be a wire added to the multilayer device 100 for the purpose of connecting the first electrode 110 to the electronic device layer 104. Similarly, the second electrode 112 may be connected to the optical layer or an optical device of the optical layer 108 by the second connector 113, which may also be similar to or different from the first connector 111.

The first and second electrodes 110 and 112 are capacitively coupled to each other such that an electrical signal may be transferred between the first and second electrodes 110 and 112. The electrical signal may be transmitted from the first electrode 110 to the second electrode 112 or vice versa. That is, the electrical signal may be generated by, and originate from, components contained in either the electronic device layer 104 or the optical layer 108. Thus, the first and second electrodes 110 and 112 facilitate electrical communication between the components contained in the electronic device layer 104 and the components contained in the optical layer 108 by allowing an electrical signal generated in either of the layers to be capacitively transmitted to the other of the layers.

The first and second electrodes 110 and 112 may be located in any reasonably suitable position with respect to the electronic device layer 104 and the optical layer 108, respectively. For example, the fist electrode 110 may be positioned substantially at the top of the electronic device layer 104 or within the metal interconnect layer 102, as depicted in FIG. 1. However, the first electrode 110 may also be positioned at the bottom of the electronic device layer 104 or embedded in the electronic device layer 104. Similarly, the second electrode 112 may be positioned above, below, or within the optical layer 108.

The positioning of the first and second electrodes 110 and 112 and the relative thicknesses of the various layers may be altered to optimize the capacitive coupling between the first and second electrodes 110 and 112. For example, as FIG. 1 illustrates, the first and second electrodes 110 and 112 are aligned substantially vertically with each other, such that the first and second electrodes 110 and 112 are at substantially the same horizontal position with respect to the parallel layers of the multilayer device 100.

To further increase the capacitive coupling between the first and second electrodes 110 and 112, the various layers may also be reduced in thickness, such that the distance between the first and second electrodes 110 and 112 is reduced. For example, the insulator layer 106 may be reduced in thickness, at least in the region between the first and second electrodes 110 and 112, so that the first and second electrodes 110 and 112 are in closer physical proximity to each other. For instance, the entire area of the insulator layer 106 may be reduced in thickness or only a portion of the insulator layer 106, such as the area of the insulator layer 106 between the first and second electrodes 110 and 112 may be reduced in thickness without altering the thickness of the rest of the insulator layer 106. A person having ordinary skill in the art will appreciate that the thickness of each of the layers of the multilayer device 100 may be increased or decreased depending on the desired properties of the multilayer device 100.

Figure 2:
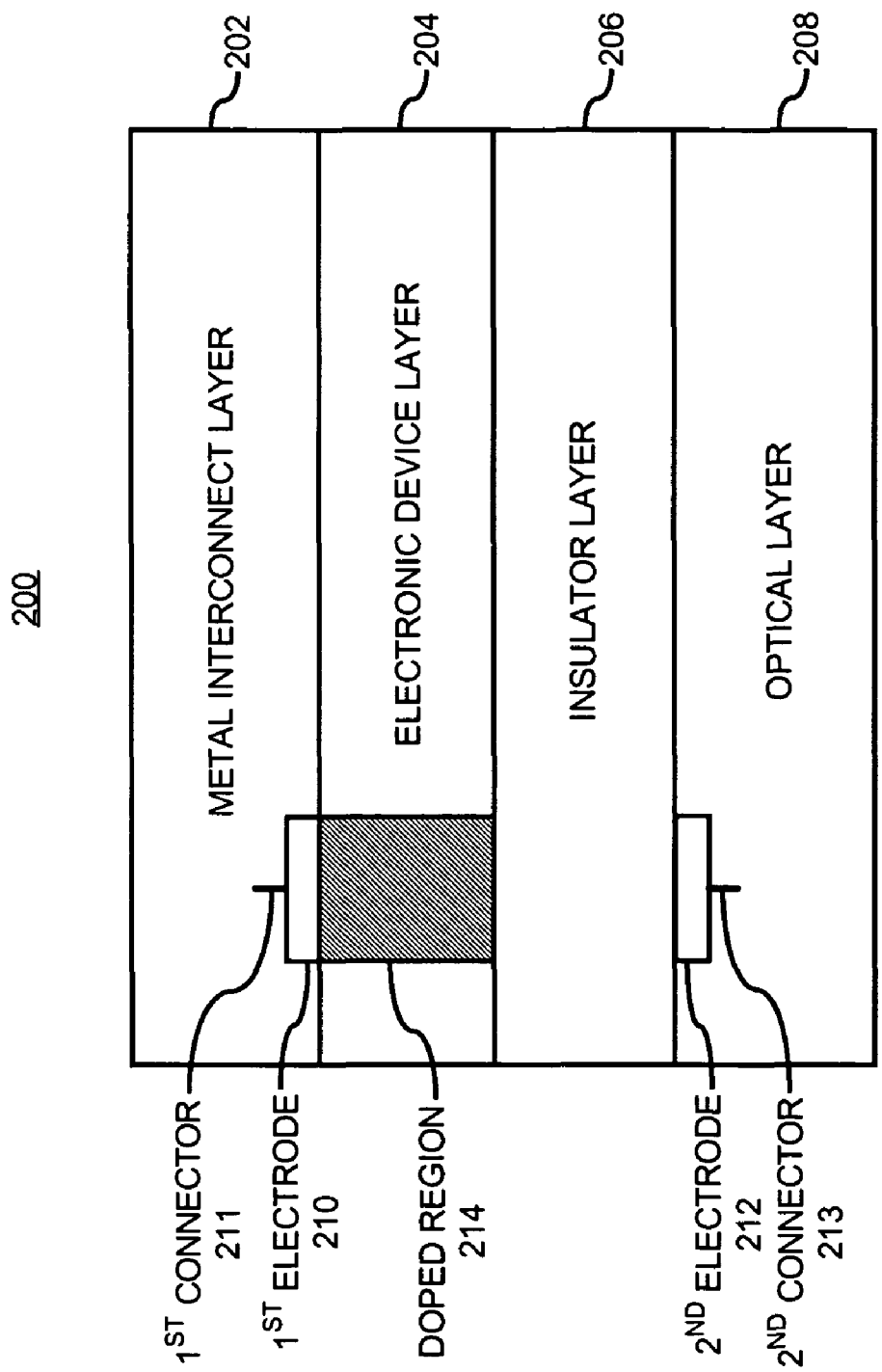
FIG. 2 illustrates a multilayer device having first and second capacitively coupled electrodes and a doped region, according to an embodiment.

FIG. 2 illustrates a multilayer device 200, according to another embodiment. The multilayer device 200 is substantially similar to the multilayer device 100, shown in FIG. 1. The multilayer device 200 includes a metal interconnect layer 202, an electronic device layer 204, an insulator layer 206, and an optical layer 208. The multilayer device 200 includes a first electrode 210 and a first connector 211 associated with the electronic device layer 204 and a second electrode 212 and a second connector 213 associated with an optical layer 208. The first and second electrodes 210 and 212 are capacitively coupled to each other for electrical communication between the electronic device layer 204 and the optical layer 208.

As further shown in FIG. 2, the electronic device layer 204 of the multilayered device 200 includes a doped region 214. The process of doping refers to the addition of a material to a region. The doped region 214 may include semi-conductive materials, such as doped silicon, where the dopant is added to a delineated section of the electronic device layer 204. The doped region 214 may enhance the capacitive coupling between the first and second electrodes 210 and 212 by locally increasing the electrical conductivity of the electronic device layer 204 in the region adjacent to the first electrode 210, thereby allowing an electrical signal to more readily pass between the first and second electrodes 210 and 212. In essence, the doped region 214 acts as an extension of the first electrode 210.

As FIG. 2 depicts, the doped region 214 is disposed between the first and second electrodes 210 and 212 and extends the entire thickness of the electronic device layer 204. However, a person having ordinary skill in the art will appreciate that the doped region 214 may extend through any length of the thickness of the electronic device layer 204 and in any configuration. For example, the doped region 214 may be a single vertical strip or a series of strips between the first and second electrodes 210 and 212. As another example, the doped region 214 may extend a distance that is shorter than the thickness of the electronic device layer 204. Similarly, the doped region 214 may be formed from a substantially homogeneous material or a substantially heterogeneous material.

The thickness, length, configuration, and materials of the doped region 214 may all be altered to substantially optimize the capacitive coupling between the first and second electrodes 210 and 212. For example, the doped region 214 may be unnecessary or undesirable if the capacitive coupling between the first and second electrodes 210 and 212 allows the electrical signal to pass optimally between the first and second electrodes 210 and 212. For instance, the thickness of the insulator layer 206 and/or the electronic device layer 204 between the first and second electrodes 210 and 212 may be sufficiently thin to allow an optimal capacitive coupling between the first and second electrodes 210 and 212. In one embodiment, depending on the materials used in the multilayer device 200, an insulator layer 206 thickness of approximately 5 to 500 nanometers (nm) may substantially allow the first and second electrodes 210 and 212 to be capacitively coupled to each other in a substantially optimized manner, thereby reducing the need for the doped region 214.

However, in another embodiment, an insulator layer 206 thickness and/or electronic device layer 204 thickness of over approximately 250 or 500 nm, for example, may reduce the ability of an electrical signal to pass between the first and second electrodes 210 and 212 at an optimal level. Therefore, in this embodiment, the doped region 214 may be formed in the electronic device layer 204 to substantially enhance the capacitive coupling between the first and second electrodes 210 and 212. While a range of distances are used in these examples, a person having ordinary skill in the art will appreciate that the distances between the first and second electrodes 210 and 212 to achieve optimal capacitive coupling will vary widely depending on the materials used to form the multilayer device 200 and the different specifications desired for the final end use applications of the multilayered device 200.

Figure 3:
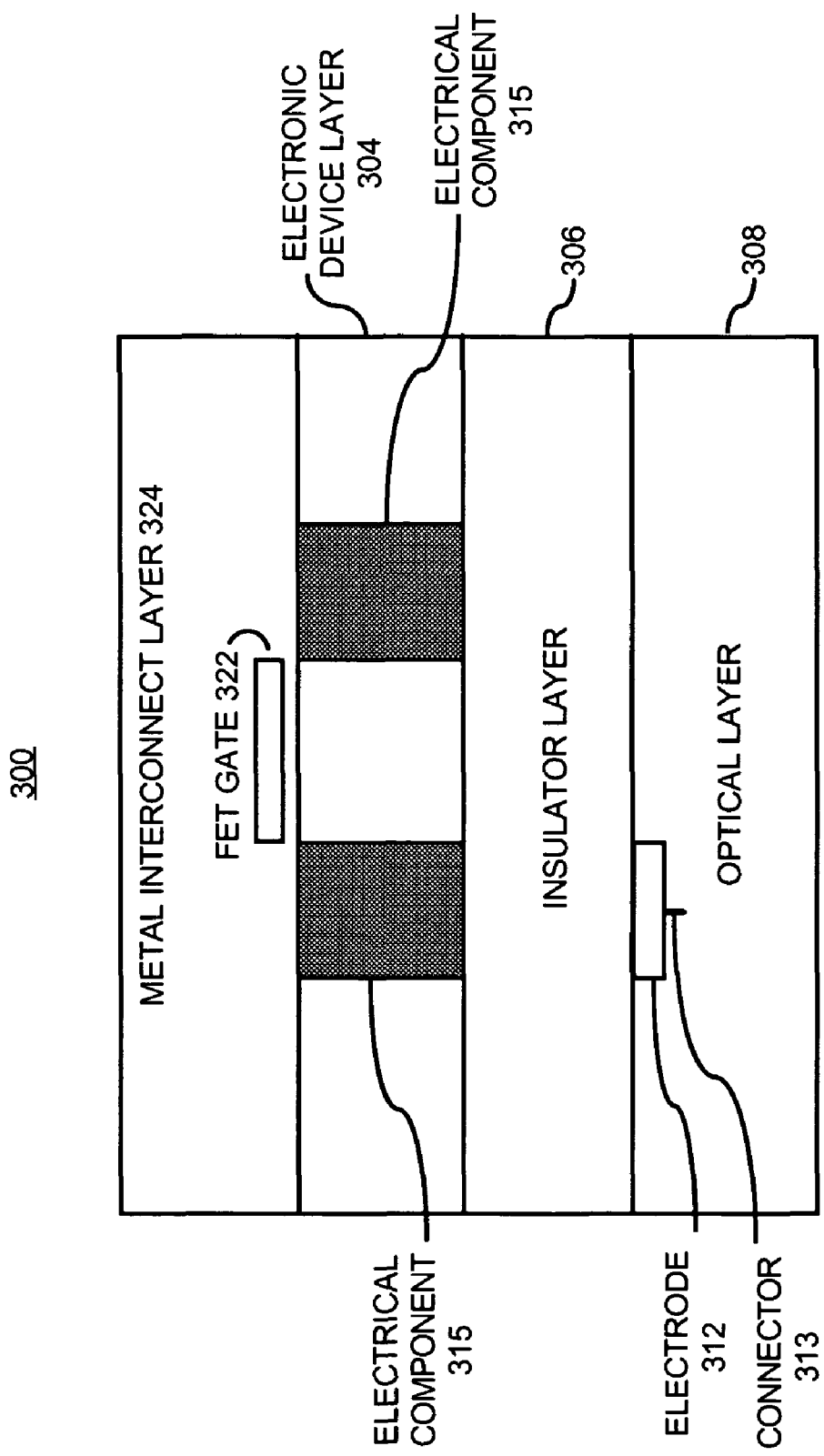
FIG. 3 illustrates a multilayer device having an electrical component capacitively coupled to an electrode, according to an embodiment.

In addition, the doped region 214 may be an integral component of the electronic device layer 204, such as a source or drain in an FET, as shown in FIG. 3. In this manner, direct communication between the optical layer 208 and the electronic device layer 204 is possible. In this particular embodiment, the first electrode 210 and the first connector 211 may not be required.

FIG. 3 illustrates a multilayer device 300, according to another embodiment. The multilayer device 300 may be similar to the multilayer device 100, shown in FIG. 1. The multilayer device 300 includes a metal interconnect layer 324, an electronic device layer 304, an insulator layer 306, and an optical layer 308. The multilayer device 300 also includes an electrode 312 and a connector 313 associated with the optical layer 308. The multilayer device 300 includes a FET gate 322 and electrical components 315 associated with the electronic device layer 304. The electrical components 315 may be any conductive element associated with the FET or the electronic device layer 304. For example, the electrical components 315 may be portions of a FET, such as source and drain regions, which are typically more heavily doped. The electrical components 315 may thus be considered as being substantially equivalent to the first electrodes 110 and 210 depicted in FIGS. 1 and 2, respectively, because the electrical components 315 may perform substantially similar functions as the first electrodes 110 and 210. That is, the electronic device layer 304 may be capacitively coupled to the electrode 312 of the optical layer 308 through the electrical components 315 of the electronic device layer 304.

While source and drain regions of a FET in the electronic device layer 304 are described in this example, a person having ordinary skill in the art will appreciate that any reasonably suitable electrical component or device may be used to facilitate the electrical communication between the electronic device layer 304 and the electrode 312 of the optical layer 308.

Figure 4:
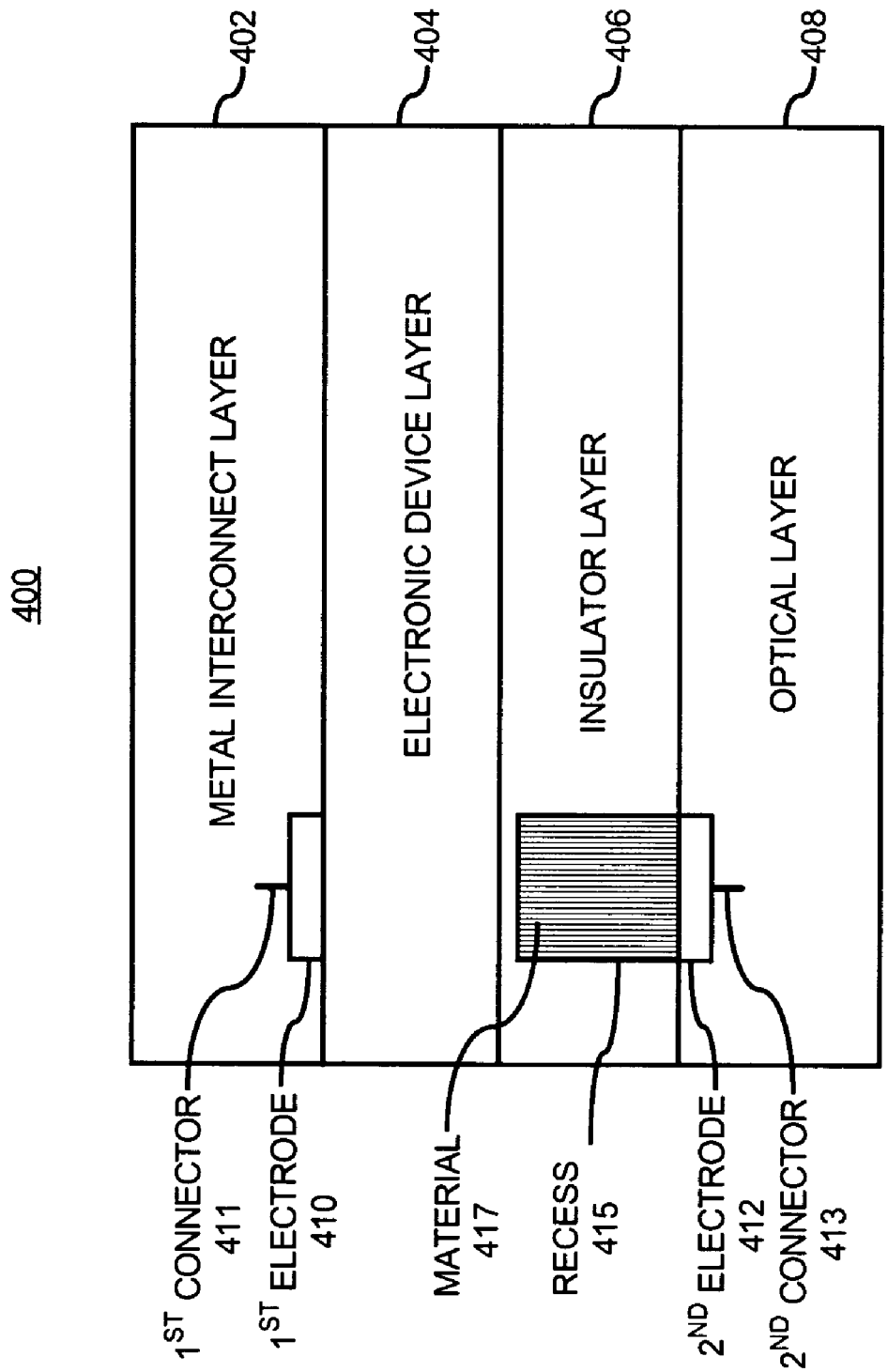
FIG. 4 illustrates a multilayer device having first and second capacitively coupled electrodes and a recess, according to an embodiment.

FIG. 4 illustrates a multilayer device 400, according to another embodiment. The multilayer device 400 is substantially similar to the multilayer device 100, shown in FIG. 1. The multilayer device 400 includes a metal interconnect layer 402, an electronic device layer 404, an insulator layer 406, and an optical layer 408. The multilayer device 400 also includes a first electrode 410 and a first connector 411 associated with the electronic device layer 404 and a second electrode 412 and a second connector 413 associated with the optical layer 408.

In FIG. 4, a recess 415 is included in the insulator layer 406 to enhance the capacitive coupling between the first and second electrodes 410 and 412. The recess 415 may be created by etching away a portion of the insulator layer 406 above the second electrode 412. The etching may be performed by any process known in the art. In addition, any reasonably suitable portion of the insulator layer 406 may be etched away. The recess 415 may be filled with a material 417, including semiconductive or conductive materials, such as a metal. If the recess 415 is filled with the material 417, the second electrode 412 and the material 417 may be formed as a single unitary component, without departing from the scope of the multilayer device 400. Thus, for instance, the recess 415 may be filled with a conductive material that extends into the insulator layer 406 to function as the second electrode 412.

The filled recess 415 may be formed, for instance, in situations where electrical signals cannot readily be transmitted between the first and second electrodes 410 and 412 at substantially optimal levels. For example, the distance between the first and second electrodes 410 and 412 may be sufficiently large to substantially prevent electrical signals from readily passing between the first and second electrodes 410 and 412. Therefore, the recess 415 may be formed in the insulator layer 406 to enhance the electrical communication between the first and second electrodes 410 and 412. A person having ordinary skill in the art will appreciate that the recess 415 may also be used in conjunction with the multilayer devices 200 and 300 illustrated in FIGS. 2 and 3, respectively. That is, the insulator layers 206 and 306 of the multilayer devices 200 and 300 may also include a recess substantially similar to the recess 415 shown in FIG. 4.

Figure 5:
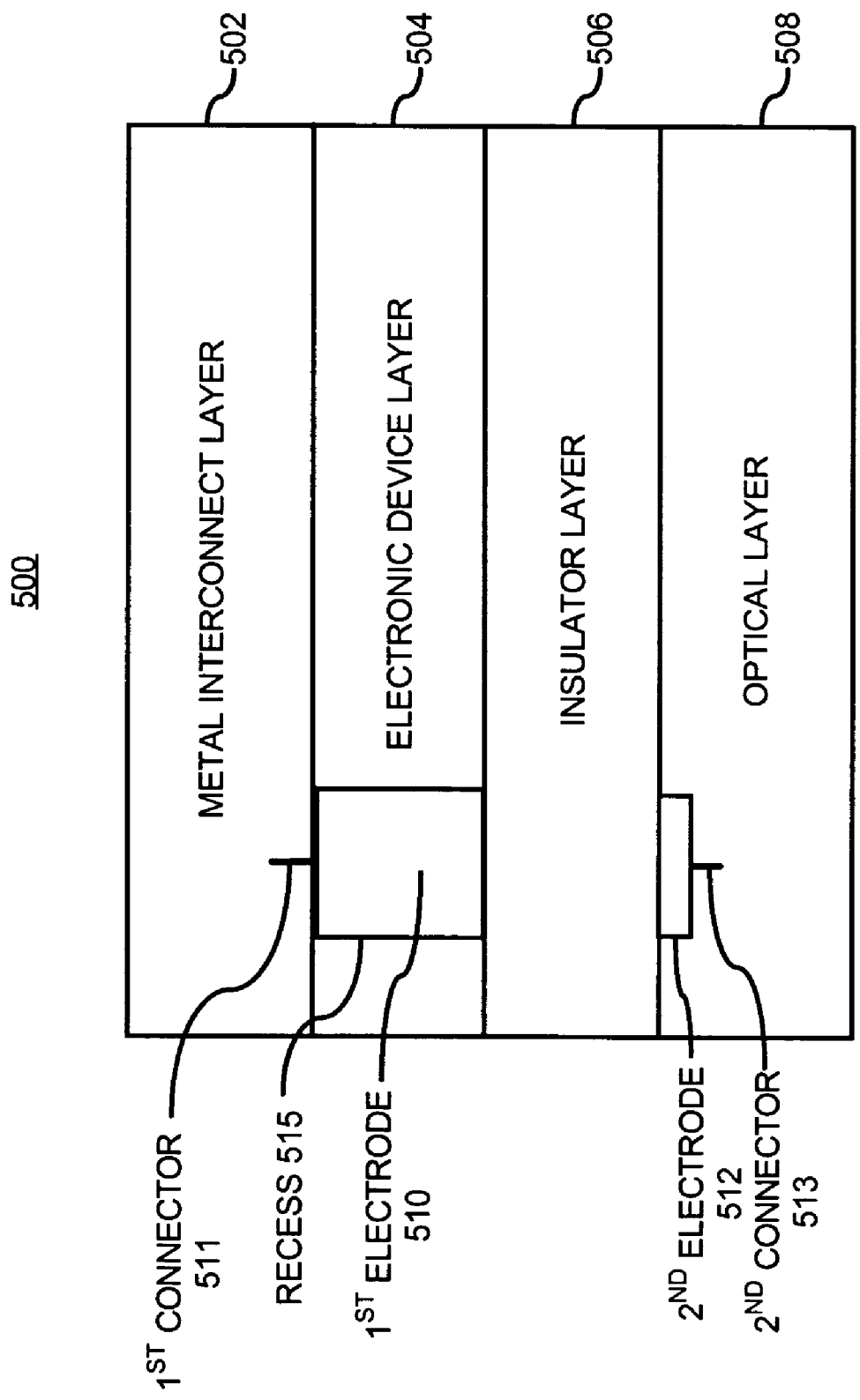
FIG. 5 illustrates a multilayer device having first and second capacitively coupled electrodes and a recess, according to an embodiment.

FIG. 5 illustrates a multilayer device 500, according to another embodiment. The multilayer device 500 is substantially similar to the multilayer device 100, shown in FIG. 1. The multilayer device 500 includes a metal interconnect layer 502, an electronic device layer 504, an insulator layer 506, and an optical layer 508. The multilayer device 500 also includes a first electrode 510 and a first connector 511 associated with the electronic device layer 504 and a second electrode 512 and a second connector 513 associated with the optical layer 508.

In FIG. 5, a recess 515 is included in the electronic device layer 504 to allow the first electrode 510 to be positioned in direct physical contact with the insulator layer 506, thus enhancing the capacitive coupling between the first and second electrodes 510 and 512 by virtue of the increased proximity of the first and second electrodes 510 and 512. The recess 515 may be formed by substantially removing semiconductor regions of the electronic device layer 504. The removal process may include any method of etching known in the art. In addition, while FIG. 5 depicts the first electrode 510 placed in direct contact with the insulator layer 506, a person having ordinary skill in the art will appreciate that any lesser portion of semiconductor material within the electronics device layer 504 may be removed, such that the first electrode 510 is in closer proximity to the insulator layer 506 by virtue of the recess 515, but not in direct physical contact with the insulator layer 506. Therefore, any reasonably suitable portion of the semiconductor material of the electronic device layer 504 may be etched away to create the recess 515.

Through implementation of the multilayer devices 100-500 depicted in FIGS. 1-5, respectively, an electronic device layer and an optical layer of a multilayer device may effectively, and capacitively, communicate with each other. In other words, the electronic device layer and the optical layer may communicate with each other by exchanging electrical signals without having to be in direct physical contact with each other. Thus, the problems associated with the formation of unintentional insulator layers between the electronic device layer and the optical layer is substantially avoided because the multilayer device is specifically designed to operate with an insulator layer between the electronic device layer and the optical layer. Moreover, as signal frequency increases between the first and second electrodes, the capacitive coupling between the electrodes increases because impedance between the electrodes decreases. The relatively large coupling capacitance between the electrodes is designed to overshadow any other capacitive elements, including stray capacitances, within the multilayer device.

Figure 6:
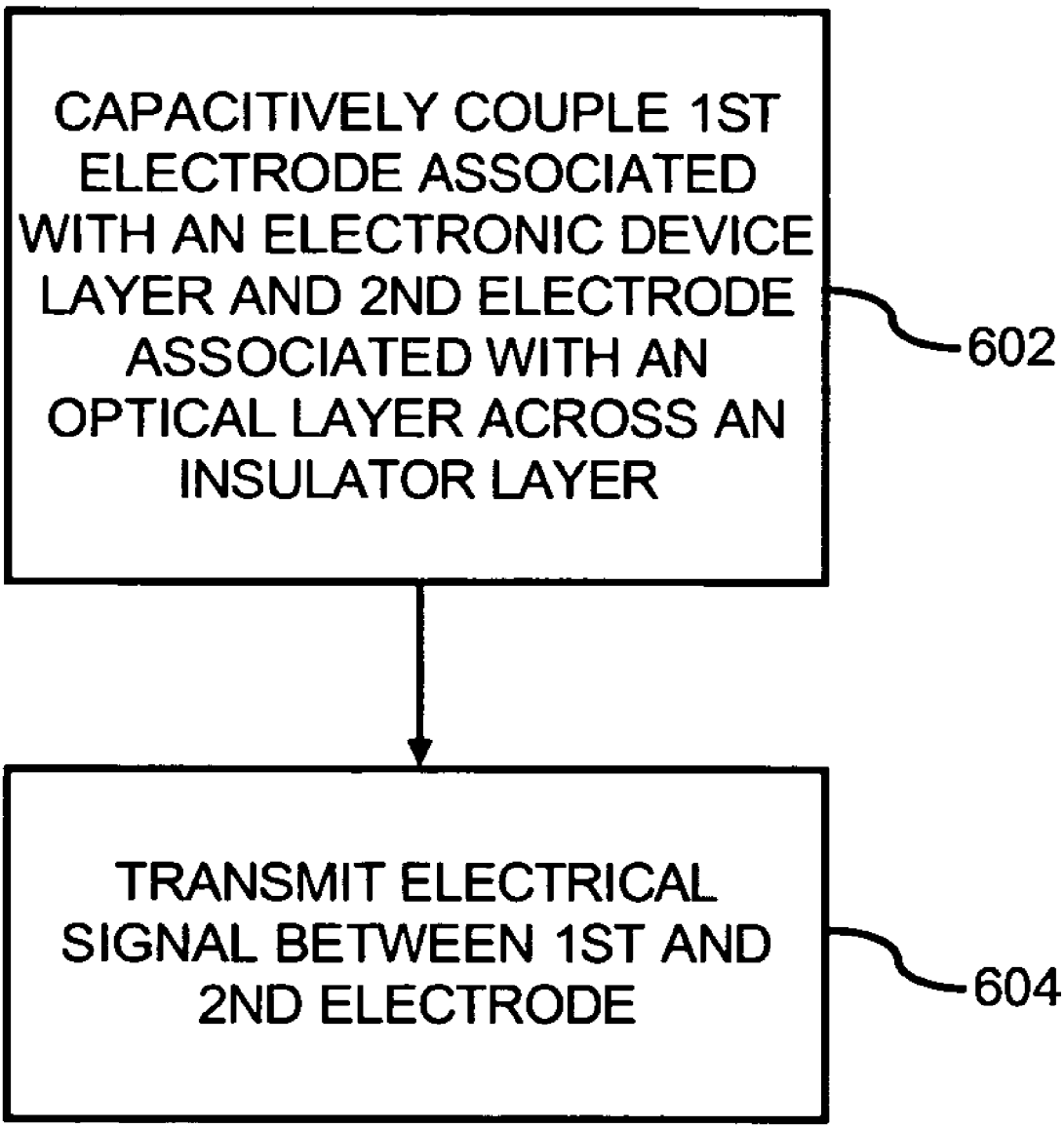
FIG. 6 illustrates a flowchart of a method for electrical communication between an electronic device layer and an optical layer, according to an embodiment.

FIG. 6 illustrates a flow chart of a method 600 of facilitating electrical communication between an electronic device layer and an optical layer of a multilayer device, according to an embodiment. For example, the method 600 may be used to facilitate electrical communication between the electronic device layer 104 and the optical layer 108 of the multilayer device 100, illustrated in FIG. 1. The method 600 is described with respect to FIGS. 1, 2, 4, and 5, by way of example and not of limitation. A person having ordinary skill in the art will appreciate that additional steps may be added to the method 600 and, similarly, that some of the steps outlined in FIG. 6 may be omitted, changed, or rearranged without departing from a scope of the method 600.

At step 602, the method 600 includes capacitively coupling a first electrode 110, 210, 410, 510 and a second electrode 112, 212, 412, 512 or an electrical component 315 and an electrode 312. The first electrode 110, 210, 410, 510 or the electrical component 315 is associated with an electronic device layer 104, 204, 304, 404, 504 of the multilayer device 100, 200, 400, 500 and the second electrode 112, 212, 412, 512 or electrode 312 is associated with an optical layer 108, 208, 308, 408, 508 of the multilayer device 100, 200, 300, 400, 500. An insulator layer 106, 206, 306, 406, 506 may be disposed between the electronic device layer 104, 204, 304, 404, 504 and the optical layer 108, 208, 308, 408, 508.

Although not explicitly stated in FIG. 6, the step of capacitively coupling the first electrode 110, 210, 410, 510 to the second electrode 112, 212, 412, 512 may further include one or more of insertion of the doped region 214 (FIG. 2), the recess 415 (FIG. 4), or the recess 515 (FIG. 5).

At step 604, the method 600 includes transmitting an electrical signal between the first and second electrodes 110, 210, 410, 510 and 112, 212, 412, 512 or between an electrical component 315 and an electrode 312. The electrical signal may be transmitted through the insulator material of the insulator layer 106, 206, 306, 406, 506 provided between the electronic device layer 104, 204, 304, 404, 505 and the optical layer 108, 208, 308, 408, 508.

While the embodiments have been described with reference to examples, those skilled in the art will be able to make various modifications to the described embodiments. The terms and descriptions used herein are set forth by way of illustration only and are not meant as limitations. In particular, although the methods have been described by examples, steps of the methods may be performed in different orders than illustrated or simultaneously. Those skilled in the art will recognize that these and other variations are possible within the spirit and scope as defined in the following claims and their equivalents.

What is claimed is:

1. A multilayer device comprising:
an electronic device layer;
a first electrode associated with the electronic device layer;
an optical layer having at least one optical device for at least one of converting electrical signals to optical signals and optical signals to electrical signals;
a second electrode associated with the optical layer, and
an insulator layer provided between the first and second electrodes, wherein the first and second electrodes are capacitively coupled to each other through the insulator layer to facilitate electrical communication between the electronic device layer and the at least one optical device of the optical layer through transmission of an electrical signal between the first and second electrodes through the insulator layer.

2. The multilayer device of claim 1, wherein the electronic device layer includes an electrical device of a complementary metal-oxide-semiconductor circuit.

3. The multilayer device of claim 1, wherein the multilayer device further comprises:
a metal interconnect layer adjacent the electronic device layer, wherein the first electrode is provided in the metal interconnect layer.

4. The multilayer device of claim 1, wherein the electronic device layer includes a doped region to enhance the capacitive coupling between the first and second electrodes.

5. The multilayer device of claim 1, wherein the electronic device layer includes an electrical component configured to enhance the capacitive coupling between the first and second electrodes.

6. The multilayer device of claim 1, wherein the electronic device layer includes an electrical component, wherein the electrical component functions as the first electrode.

7. The multilayer device of claim 1, wherein at least one of the insulator layer and the electronic device layer includes a recess.

8. The multilayer device of claim 7, wherein the recess includes at least one of a conductive and a semi-conductive material to enhance the capacitive coupling between the first and second electrodes.

9. The multilayer device of claim 1, wherein the first electrode is in direct physical contact with the insulator layer.

10. A multilayer device comprising:
an electronic device layer;
a first electrode associated with the electronic device layer;
an optical layer having at least one optical device for at least one of converting electrical signals to optical signals and optical signals to electrical signals;
a second electrode connected to the at least one optical device;
means for at least partially insulating the first electrode from the second electrode; and
means for capacitively coupling the first electrode to the second electrode to transmit an electrical signal through the means for at least partially insulating, to facilitate electrical communication between the electronic device layer and the at least one optical device of the optical layer through the means for at least partially insulating the electronic device layer.

11. The multilayer device of claim 10, further comprising:
means for enhancing capacitive coupling between the electronic device layer and the optical layer.

12. A method of electrical communication between an electronic device layer and an optical layer of a multilayer device, wherein the electronic device layer and the optical layer are at least partially separated by an insulator layer, the method comprising:
capacitively coupling a first electrode and a second electrode, wherein the first electrode is associated with the electronic device layer of the multilayer device and the second electrode is connected to at least one optical device of the optical layer, wherein the at least one optical device is configured to at least one of convert electrical signals to optical signals and optical signals to electrical signals;
transmitting an electrical signal between the first and second electrodes through the insulator layer provided between the electronic device layer and the optical layer; and
converting the electrical signal to an optical signal in the optical layer.

13. The method of claim 12, further comprising:
doping at least a portion of the electronic device layer to increase the conductivity of the at least a portion of the electronic device layer.

14. The method of claim 13, wherein transmitting the electrical signal between the first and second electrodes further comprises:
transmitting the electrical signal through the doped portion of the electronic device layer.

15. The method of claim 12, wherein the electronic device layer includes at least one electrical component, and wherein capacitively coupling the first electrode and the second electrode further comprises:
capacitively coupling the first and second electrodes using the at least one electrical component of the electronic device layer to enhance the capacitive coupling between the first and second electrodes.

16. The method of claim 15, wherein transmitting the electrical signal between the first and second electrodes further comprises:
transmitting the electrical signal using the at least one electrical component of the electronic device layer to enhance the capacitive coupling between the first and second electrodes.

17. The method of claim 12, further comprising:
forming a recess in at least one of the electronic device layer and the insulator layer, wherein the recess is configured to reduce material between the first electrode and the second electrode.

18. The method of claim 17, further comprising:
depositing at least one material selected from a conductive material and a semi-conductive material into the recess, and
wherein transmitting the electrical signal between the first and second electrodes further comprises transmitting the electrical signal through the recess.

19. The method of claim 12, further comprising:
positioning the first electrode to be in direct contact with the insulator layer.

20. The method of claim 12, wherein transmitting the electrical signal between the first and second electrodes further comprises at least one of:
generating the electrical signal by the optical device and transmitting the electrical signal from the second electrode to the first electrode; and
generating the electrical signal by the electronic device layer and transmitting the electrical signal from the first electrode to the second electrode.

* * * * *